(12) United States Patent
Reeswinkel et al.

(10) Patent No.: US 10,243,110 B2
(45) Date of Patent: Mar. 26, 2019

(54) OPTOELECTRONIC DEVICE AND METHOD FOR THE PRODUCTION OF AN OPTOELECTRONIC DEVICE

(71) Applicant: OSRAM Opto Semiconductors GmbH, Regensburg (DE)

(72) Inventors: Thomas Reeswinkel, Regensburg (DE); Gudrun Lindberg, Bad Abbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/555,964

(22) PCT Filed: Mar. 3, 2016

(86) PCT No.: PCT/EP2016/054547
§ 371 (c)(1),
(2) Date: Sep. 5, 2017

(87) PCT Pub. No.: WO2016/142267
PCT Pub. Date: Sep. 15, 2016

(65) Prior Publication Data
US 2018/0069156 A1   Mar. 8, 2018

(30) Foreign Application Priority Data
Mar. 6, 2015   (DE) .................. 10 2015 103 335

(51) Int. Cl.
*H01L 21/44* (2006.01)
*H01L 33/44* (2010.01)
(Continued)

(52) U.S. Cl.
CPC ............ *H01L 33/44* (2013.01); *C08G 77/385* (2013.01); *C09D 183/08* (2013.01); *G02B 6/4239* (2013.01)

(58) Field of Classification Search
CPC ...... H01L 33/44; C08G 77/385; C09D 183/08; G02B 6/4239
See application file for complete search history.

(56) References Cited

U.S. PATENT DOCUMENTS 4,539,061 A   9/1985 Sagiv
2006/0175603 A1   8/2006 Schmid et al.
(Continued)

FOREIGN PATENT DOCUMENTS

DE   102008006374 A1   4/2009
JP   2007099835 A   4/2007
(Continued)

OTHER PUBLICATIONS

Owen M.J. et al.; "A review of significant directions in flourosiloxane coatings" Surface Coatings International Part B: Coatings Transactions; vol. 87, B2, pp. 71-76; Jun. 1, 2004.
(Continued)

*Primary Examiner* — Victor A Mandala
*Assistant Examiner* — Colleen E Snow
(74) *Attorney, Agent, or Firm* — McDermott Will & Emery LLP

(57) ABSTRACT

The invention relates to an optoelectronic device (1) comprising at least one outer surface (2) containing silicone (20), chemical compounds, comprising an anchor group (3) and a head group (4), being bonded to the silicone via the anchor group, and the adhesion of the regions of the silicone (2) present on the outer surface being reduced owing to the head groups of the chemical compounds. A method for producing an optoelectronic device is also disclosed.

18 Claims, 8 Drawing Sheets

Figure 1A:
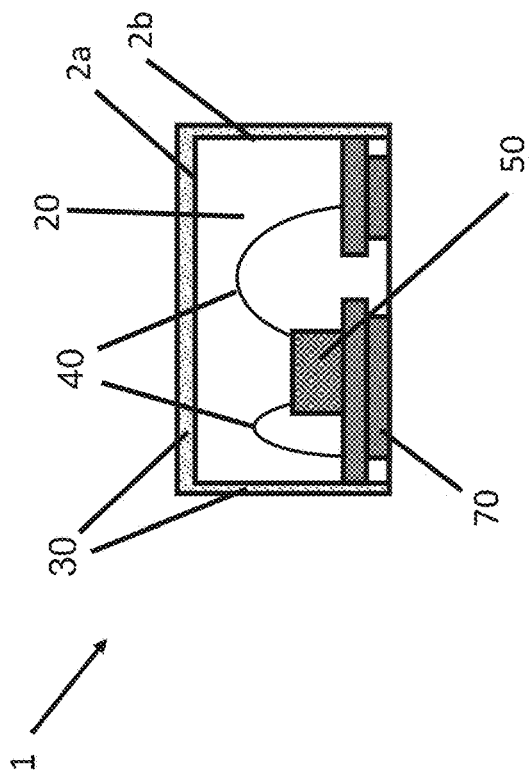

(51) Int. Cl.
     *C09D 183/08*      (2006.01)
     *C08G 77/385*      (2006.01)
     *G02B 6/42*      (2006.01)

(56) References Cited

U.S. PATENT DOCUMENTS

2009/0123764 A1*   5/2009   Morita ................... C08G 77/20
                                                                        428/446
2010/0220396 A1    9/2010   Kraeuter et al.

FOREIGN PATENT DOCUMENTS

| JP | 2007103494 A | 4/2007 |
|---|---|---|
| JP | 2010245477 A | 10/2010 |
| JP | 2012519930 A | 8/2012 |
| WO | WO-2014004840 A1 | 1/2014 |

OTHER PUBLICATIONS

Gelest "Silane Coupoling Agents: Connecting Across Boundaries" Version 2.0; 2006, Gelest, Inc; pp. 1-56.
Synquest Laboratories "1H,1H,2H,2H-Perfluorodecyltrichlorosilane" Safety Data Sheet 5181705; Version 1.0; according to Federal Register vol. 77, No. 58; Dec. 8, 2016; pp. 1-7.

\* cited by examiner

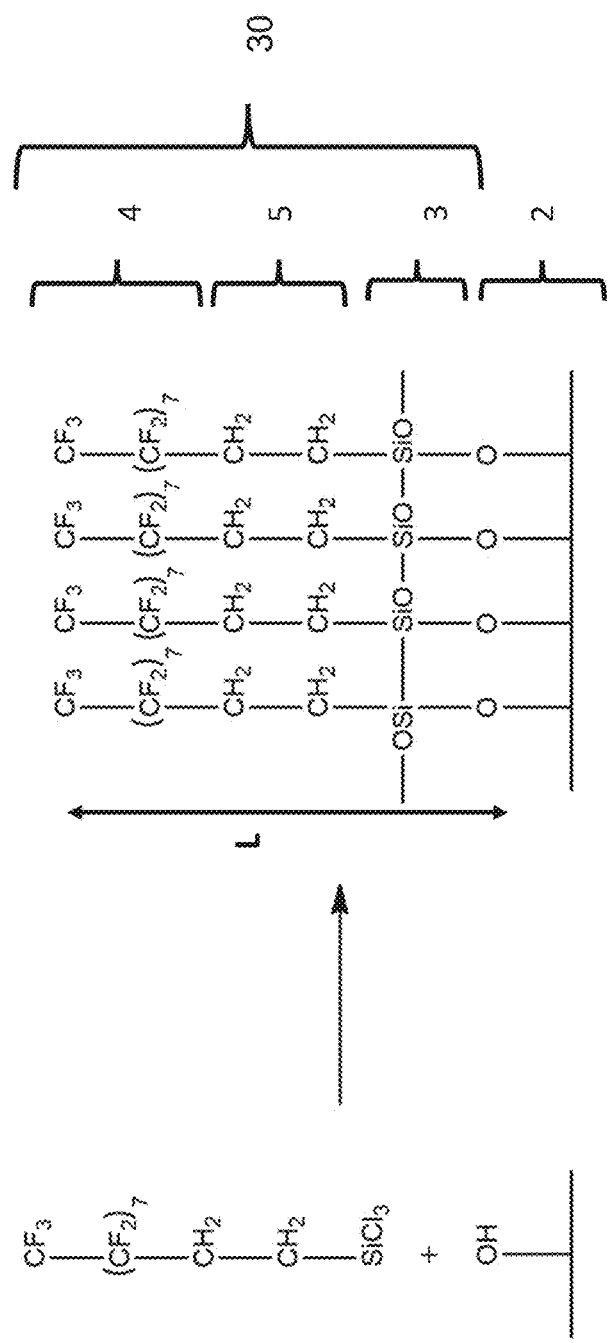

OPTOELECTRONIC DEVICE AND METHOD FOR THE PRODUCTION OF AN OPTOELECTRONIC DEVICE

DESCRIPTION

The invention relates to an optoelectronic device and a method for the production of an optoelectronic device.

Optoelectronic devices often have components made of silicone on their surfaces, which can be tacky. Since high tack or high adhesion, for instance towards particles from the environment, can lead to numerous problems in manufacturing and also during operation of optoelectronic devices, it is desirable to reduce the tack of the outer silicone surfaces of optoelectronic devices.

In conventional optoelectronic devices, this problem is often overcome by the use of harder silicones, which in some cases are less tacky. However, this significantly restricts the range of possible silicones that can be used. In addition, even relatively high hardness is no guarantee of sufficiently low tack. Furthermore, harder silicones can only be employed in certain manufacturing methods. For many production methods, e.g. those in which bonding wires are employed in the optoelectronic device, harder silicones cannot be used or can lead to other problems.

One way of reducing tack or adhesion is to seal the silicone surface with non-tacky, polymeric to glassy layers by means of active deposition using a plasma method. The monomer hexamethyldisiloxane (HMDSO) is used as a starting material here, or similar monomers (e.g. with other alkyl groups instead of the methyl group). However, the oxidizing plasma needed for this method can oxidase, and thus discolor, metal surfaces (e.g. for lead frames), for example silver surfaces, and can in particular cause difficulties with their electrical connection or further technical processing (bonding, soldering). Often, this method also leads directly to an undesirable coating of the electrical bonding pads with the deposited polymeric to glassy material, since it is often impossible to restrict the coating to the surface regions with silicone. The formation of multi-layers also occurs, and thus layers which are in some cases thick or the thickness of which is difficult to control. However, an accurately defined layer thickness is of crucial importance for the quality of optoelectronic devices and in particular affects their transparency and coloring. Unnecessarily thick coatings, or coatings that vary in their thicknesses, can result in an undesirable, hazy or even "milky" appearance of the optoelectronic device.

The object of the invention is therefore to provide an optoelectronic device having relatively low tack. This object is achieved by an optoelectronic device according to claim 1. Further embodiments of the optoelectronic device and a method for the production of an optoelectronic device having low tack are the subject matter of further claims.

The subject matter of the invention according to the main claim 1 is an optoelectronic device comprising at least one outer surface with a silicone, wherein chemical compounds comprising an anchor group and a head group are bound to the silicone via the anchor group and wherein the adhesion of the regions of the silicone located on the outer surface is reduced by the head groups of the chemical compounds.

Adhesion here denotes tack, in particular the tendency of the outer surface comprising silicone to adhere to particles from the environment. These can be, for example, particles such as those that are often to be found in industrial-scale manufacturing processes. They can be, for example, metal dusts or metal chips (e.g. with an average particle size of approx. 10-50 μm), ceramic dusts (e.g. with an average particle size of a few micrometers) or silicone particles that have been detached. Many of these particles are formed during the production process of the optoelectronic device, e.g. during sawing or separating steps. Thus, in the production of optoelectronic devices, for example, substrates or other components are sawn or separated by other means, during which operation e.g. sawdust-like dust particles are formed. Other environmental particles (e.g. normal dust and other contaminants) are also added to the particles obtained in the course of the production process. Typical particle sizes in this case are generally in the micrometer range. Moreover, adherence to silicone surfaces of optoelectronic devices can occur not only during the manufacture of the device itself but also during its subsequent application. The nature of the particles or possible other contaminants is therefore also partly dependent on the location where the optoelectronic device is later employed.

Figure 6A:
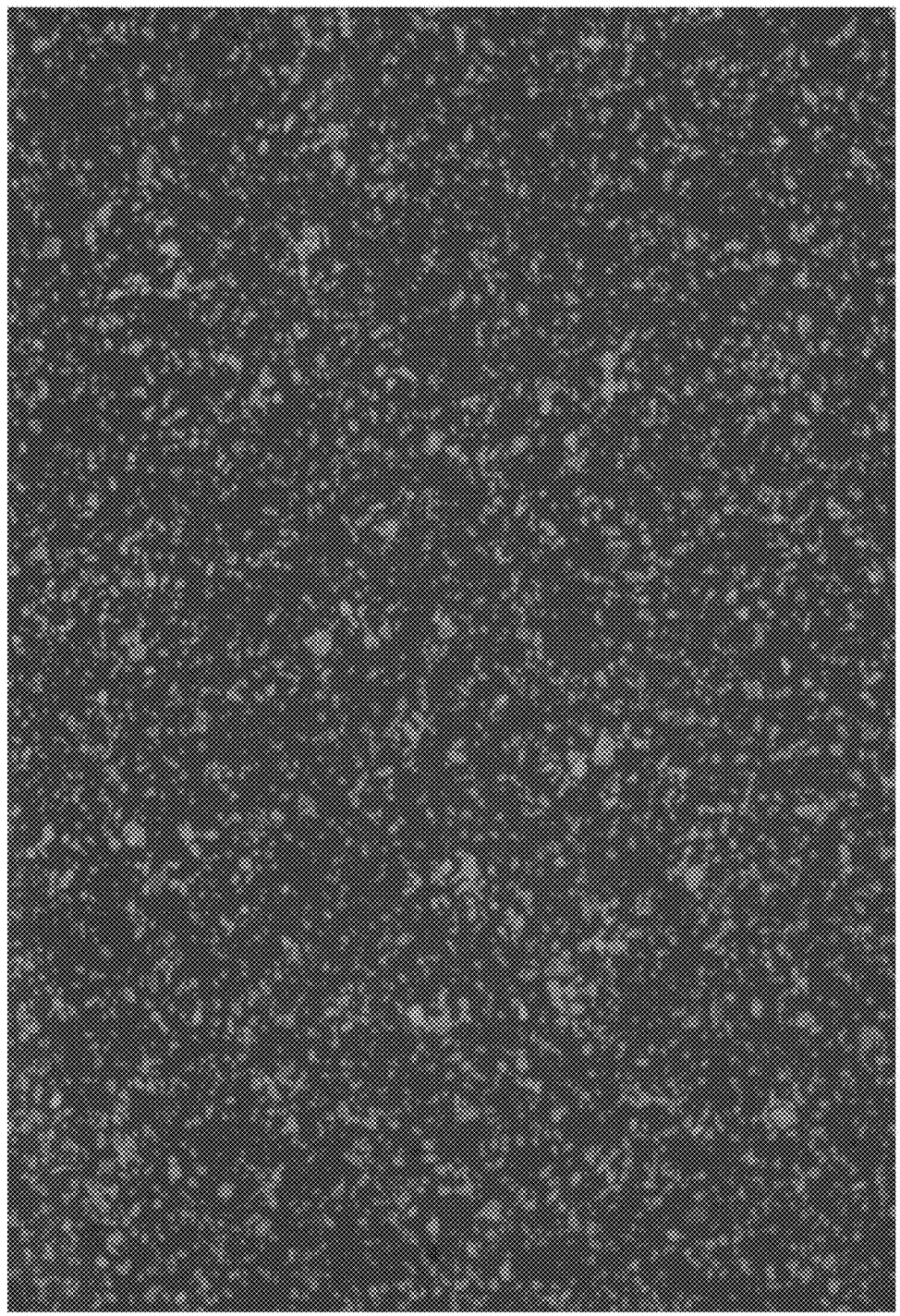
Figure 6B:
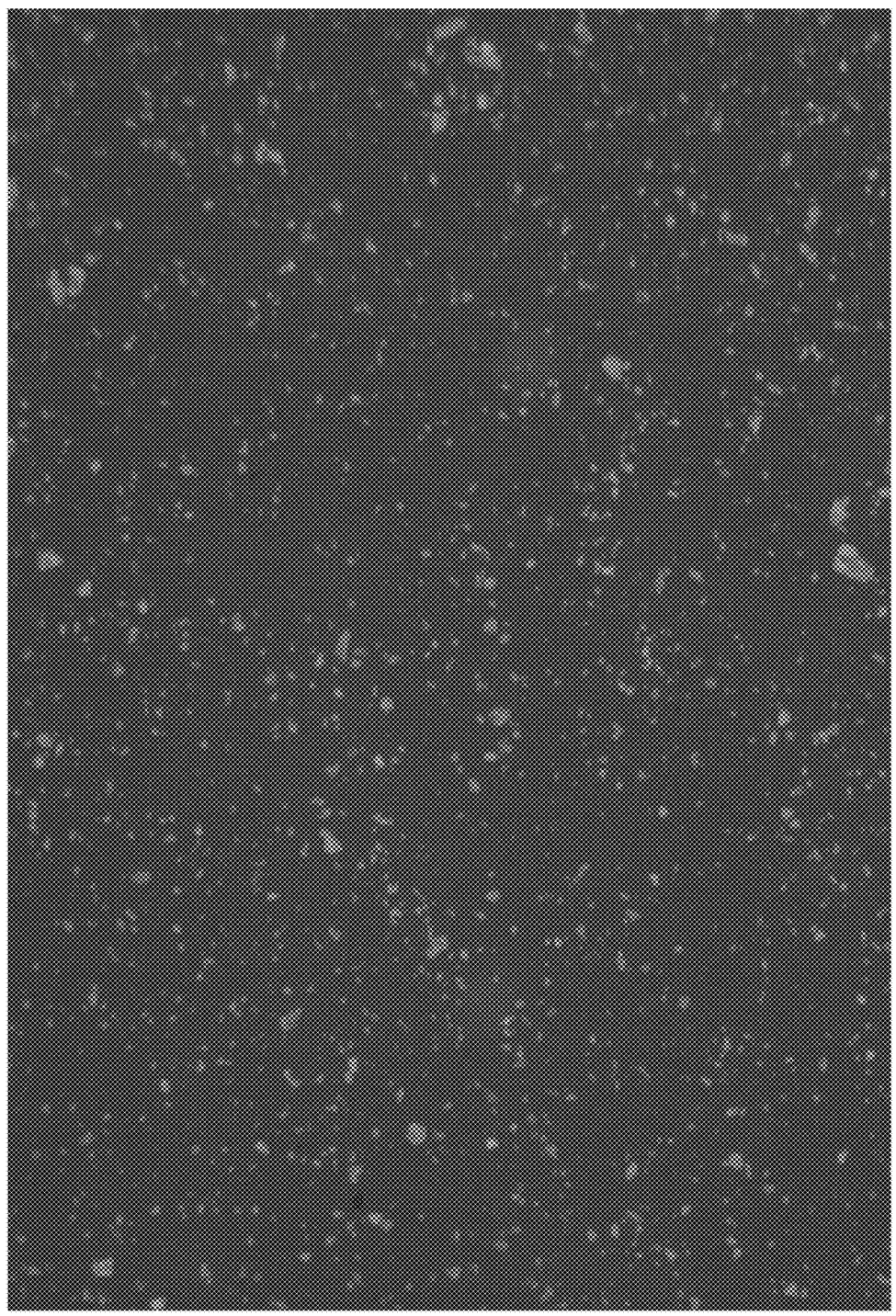
Figure 6C:
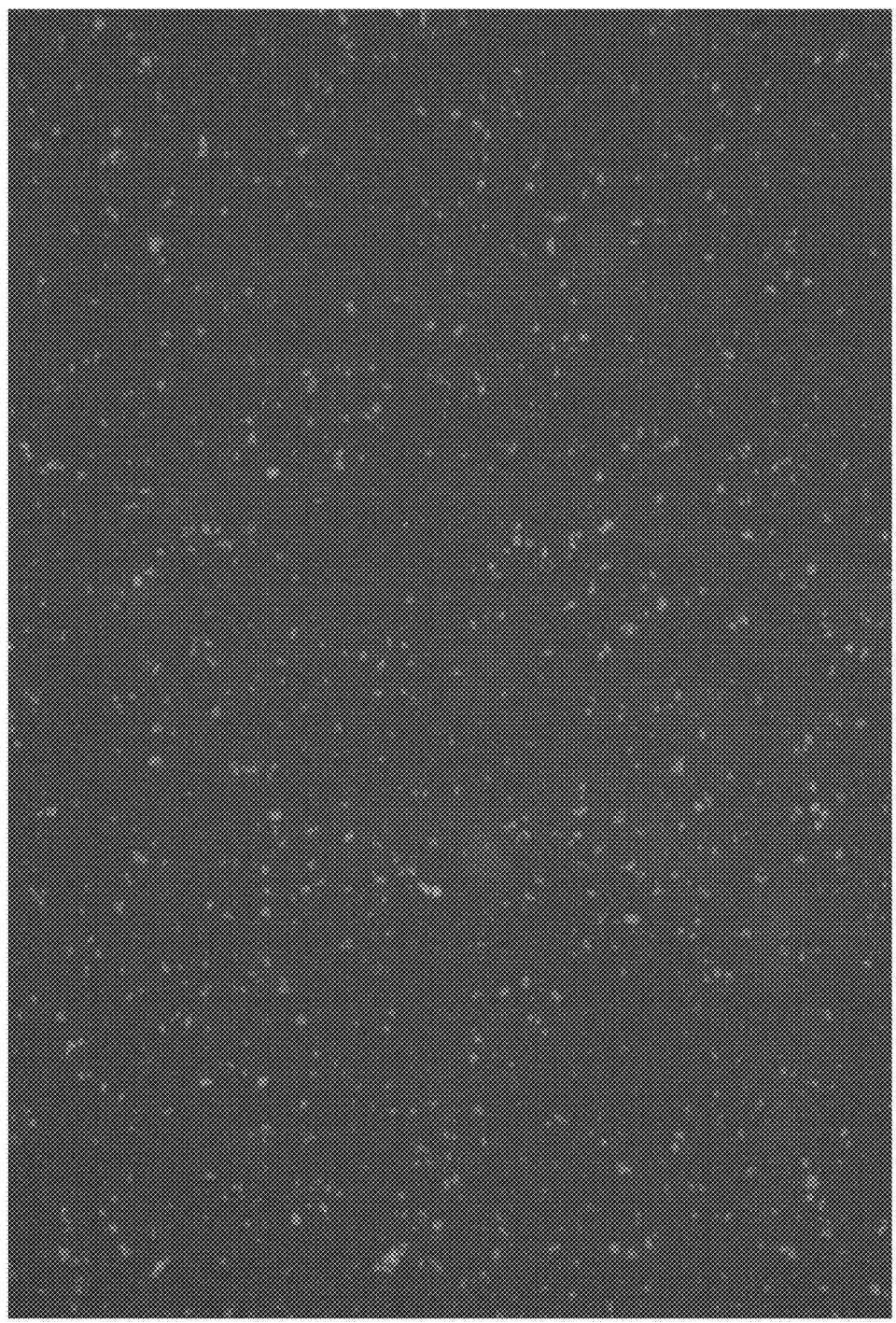

Adhesion or the tendency towards particle adherence can be determined experimentally by means of a particle adhesion test. In the particle adhesion test, each silicone surface to be tested is pressed with the same intensity into a vessel containing the test particles. Alternatively, the particles can also be scattered over the silicone surface. It is crucial in each case that the surface is completely covered with particles and that the sample and reference sample are both treated identically. The test particles can be, for example, metal chips or powder or other particles or particle mixtures, with which the expected contamination can be reproduced (in terms of size, shape and material). For particle adherence tests, therefore, numerous possible particles can be considered. In the case of the present invention, a particle mixture composed of finely ground common salt and pepper particles was used for particle adherence tests (FIGS. 6A, 6B, 6C). The inventors of the present invention have observed that, with finely ground common salt and pepper particles having an average particle size of approx. 5 to 500 μm, particle adherence to silicone surfaces can be simulated by simple means. After being brought into contact with the particles, the silicone surface is blown with air or nitrogen, whereby loose particles are removed while adhering particles remain on the surface. To this end, an air or nitrogen stream with a pressure of approx. 1.5 bar was typically used in the particle adherence tests; however, other methods or pressures (e.g. in a range of between 1 and 5 bar) can also be considered in order to allow comparative tests to be carried out on different silicone surfaces with good reproducibility.

The inventors of the present invention have found that the tack properties of optoelectronic devices comprising silicones on at least one of their outer surfaces can be affected by binding chemical compounds thereto. Particularly suitable for this are chemical compounds comprising an anchor group and a head group, wherein the head group has properties that allow a reduction of adhesion, i.e. tack, while the anchor group binds the chemical compounds to the surface of the silicone. The anchor group is therefore bound to the silicone surface while the head group is directed outwards, i.e. away from the silicone or device surface. By means of an outer surface of the silicone that has been modified in this way, the tack or adhesion of the silicone surface, and thus of the optoelectronic device, can be reduced significantly.

The inventors of the present invention have found that, in this way, the manufacture and packaging of optoelectronic devices can be made significantly easier. Whereas conventional optoelectronic devices comprising tacky silicone surfaces often stick to one another during the production process or adhere to equipment employed during manufacture, these problems are significantly reduced with optoelectronic devices according to the invention. Thus, for example, with optoelectronic devices according to the invention, adhering to conveying equipment used during production, such as e.g. shaker conveyors, sorters or tapers, occurs significantly less frequently. This leads to a significant reduction in rejects during production and thus to lower production costs. It is also crucial to the cost reduction for the production and packaging of the optoelectronic devices according to the invention that, because of the reduced adhesion or tack, manual intervention is needed significantly less frequently. The optoelectronic devices according to the invention can thus be produced and packaged not only with fewer rejects but also with lower staff costs.

These advantages also relate to the further use of the optoelectronic device. Optoelectronic devices are important constituents of many products. During the production of these products, the insertion or mounting of optoelectronic devices is a central process step. Since the optoelectronic devices according to the invention have significantly lower tack, these processes can also be made easier. In particular, the insertion of components into products can also take place with lower staff costs, fewer rejects and a higher overall degree of automation. Not only does the present invention therefore allow a reduction in the costs of producing and packaging the optoelectronic devices themselves, but production processes in which the optoelectronic devices are incorporated into further products can also be made significantly more efficient in this way.

The inventors have also found that, in optoelectronic devices according to the invention, an undesirable adherence of particles from the environment is significantly reduced. This relates both to the manufacturing process and to subsequent operation.

Adhering particles affect the properties of optoelectronic devices in an undesirable manner. For example, in radiation-emitting optoelectronic devices, a change in the emission characteristics can occur as a result of adhering particles. If, for example, the optoelectronic device is a light-emitting diode (LED), particle adherence or the adhesion of environmental particles can lead to losses of brightness. In photosensitive devices, conversely, particle adherence can lead to a reduction in sensitivity. Particle adherence is reduced significantly by the optoelectronic devices according to the invention, and this can have a positive effect on the efficiency and lifespan of the optoelectronic device. The inventors have also found that the optoelectronic devices according to the invention can be produced more easily than conventional optoelectronic devices, since the use of chemical compounds having anchor groups and head groups, with the binding to the silicone surface taking place via the anchor group, can permit a selective binding only to surface regions of the optoelectronic device comprising silicones. In this way, it may be possible to avoid a coating of e.g. metal contacts, for instance silver contacts. A complex subsequent exposure of the contacts, which have to be electrically conductive, can thus be avoided. The optoelectronic devices according to the invention are therefore easier to manufacture because the adhesion-reducing coating can take place in a controlled manner. Furthermore, in the case of the present invention, even if undesired regions are coated it is often possible to dispense with a removal of the coating because of the well-controlled, low layer thickness. Because of the very thin layers employed, bonding is often possible even without removing the coating.

A series of developments of the optoelectronic device according to the invention are presented below.

A particularly preferred embodiment of the optoelectronic device according to the invention is distinguished by the fact that the chemical compounds that are bound to the silicone via anchor groups form a monomolecular layer. The formation of multiple layers on the silicone surface, one on top of another, does not therefore occur.

The inventors of the present optoelectronic device have found that, in this way, particularly thin layers of a few nanometers, for example less than 100 nm, in particular less than 50 nm, preferably less than 10 nm, more preferably less than 5 nm and particularly preferably less than 3 nm, are possible. Despite the very thin layer thicknesses in the case of the present invention, the adhesion can be reduced significantly with respect to particle adherence. The desired effect can thus be achieved with low material usage.

Furthermore, the inventors have found that layer thicknesses that are too low can lessen the adhesion-reducing effect in some cases. It can therefore be preferable if, for example, the layer thickness is no lower than e.g. 0.5 nm.

By means of the fact that multiple layers are avoided, undesired changes in properties can also be avoided. For example, undesirable changes to radiation transmission or transparency or a change to the refractive index of silicones can often be avoided in this way. Undesirable changes to the color properties are generally also avoidable in this way.

Another development of the optoelectronic device according to the invention is distinguished by the fact that the chemical compounds that are bound to the silicone via the anchor group form a self-assembling monolayer (SAM). A layer that shields the tacky silicone surface can be created by a self-assembling monolayer.

The inventors have found that the reduction in adhesion is particularly effective the more compact the arrangement of the chemical compounds. SAMs are most particularly suitable for this purpose, since they have a high degree of order and thus allow a compact arrangement of the chemical compounds on the silicone surface.

Another preferred form of the optoelectronic device according to the invention comprises a head group which is a linear or branched alkyl group, which can in particular also be fluorinated.

With linear alkyl groups or linear fluorinated alkyl groups, the chemical compounds can be arranged on the silicone surface in a particularly compact manner. The more compact the arrangement of the chemical compounds, the more significant the possible reduction in adhesion e.g. towards environmental particles. For example, compact SAMs can also be produced particularly well with linear alkyl groups or linear fluorinated alkyl groups. Fluorinated head groups lead to a particularly significant reduction in adhesion, which has also been proven in particle adherence tests in the present invention. Furthermore, fluorinated groups have the effect of leading to a reduction in the coefficient of friction. Coefficients of friction represent a measure of the sliding friction, and in particular the static friction, and thus also reflect the bonding properties or adhesive properties. In the case of the present invention, fluorinated head groups permit a decrease in the coefficient of friction, that is to say a reduction in the adhesion of the optoelectronic devices according to the invention. Fluorinated head groups can also bring a reduction in contaminations of various kinds owing to their good hydrophobic and oleophobic properties. In some cases, a self-cleaning effect may even be possible, since drops of liquid can run off layers comprising fluorinated head groups, thereby also possibly washing off particles.

The inventors have found that branched alkyl groups or branched fluorinated alkyl groups as head groups also permit a reduction in adhesion, the high steric bulk of the branched alkyl groups or fluorinated branched alkyl groups being utilized to cover or shield a broad region of the silicone surface.

The term alkyl groups or fluorinated alkyl groups always signifies groups with a chain length of in particular $C_1$ to $C_{100}$, preferably $C_1$ to $C_{50}$, more preferably $C_1$ to $C_{20}$, particularly preferably $C_1$ to $C_{10}$. Further preferred chain lengths are, for example, chain lengths in the range of $C_2$ to $C_{20}$ and $C_2$ to $C_{10}$ as well as $C_3$ to $C_{20}$ and $C_3$ to $C_{10}$.

The inventors of the optoelectronic device according to the invention have found that even short alkyl groups, or short fluorinated alkyl groups, can achieve the desired effect of reducing particle adhesion. The shorter the alkyl groups, the thinner the layer that forms. The thinner the layer, the smaller will be the effect on the other desirable properties of the silicone.

Furthermore, it can be preferable e.g. for the chain length of the alkyl groups or fluorinated alkyl group to be greater than or equal to $C_2$ and in particular greater than or equal to $C_3$, so that the adhesion-reducing action can take full effect.

A most particularly preferred development of the optoelectronic device according to the invention has as the head group an at least partly fluorinated linear or branched alkyl group, in particular a perfluorinated alkyl group.

The inventors of the present invention have found that the adhesion is reduced particularly significantly by using head groups comprising fluorinated alkyl groups. Furthermore, the inventors have found that the reduction in adhesion is all the more marked the higher the degree of fluorination of the alkyl group. Consequently, the adhesion is reduced particularly strongly when the alkyl group is an alkyl group comprising many F atoms. Most preferred are perfluorinated alkyl groups as head groups.

In another particularly preferred development of the invention, the alkyl group is a linear fluorinated alkyl group and in particular a linear perfluorinated alkyl group. For example, the linear perfluorinated alkyl group can be a group of the general formula $C_nF_{2n+1}$ with n=1 to 100, in particular n=1 to 50, preferably n=1 to 20, more preferably n=1 to 10. Furthermore, n=2 to 10 or even n=3 to 10 may be preferred. For example, the head group can be fluorinated, in particular perfluorinated, methyl, ethyl, n-propyl, n-butyl, n-pentyl, n-hexyl, n-heptyl, n-octyl, n-nonyl or n-decyl.

In a particularly preferred embodiment of the optoelectronic device according to the invention, the anchor group of the chemical compounds is bound to the silicone by a covalent bond. The bond is therefore a directional bond. The chemical compounds are therefore bound to the silicone surface by means of chemisorption. This type of binding is particularly stable.

In a further preferred development of the optoelectronic device according to the invention, the anchor group of the chemical compounds is bound by a covalent bond to chemically active centers of the silicone surface. The chemically active centers here can be functional groups on the silicone surface which, because of their chemical nature, are capable of entering into covalent bonds with the anchor group of the chemical compounds.

The nature of the chemically active centers on the silicone surface here can by affected by various types of pretreatment of the silicone. Various kinds of plasma treatments, for example, can be considered here. For example, it is possible to perform plasma treatments under low-pressure or atmospheric conditions. Various types of gases or mixtures of gases can be employed, for example. In addition, wet chemical pretreatments can also be considered. However, it is also possible in principle to utilize the natural active surface centers of the silicone without any pretreatment.

In principle, all functional groups on the silicone surface that can be attached to a suitable anchor group as a partner can be considered as active surface centers. It is crucial only that the chemically active surface center on the silicone surface and the anchor group enter into a stable covalent bond and thus allow a durable attachment or binding of the chemical compounds to the silicone surface.

In one development of the above-mentioned embodiment, the anchor group can be an electrophile and the active surface center on the silicone surface can be a nucleophile and vice versa.

Typical active surface centers on the silicone surface can be e.g. silicone surface-OH, silicone surface-OOH, and also silicone surface-$R^c$—COOH, wherein $R^c$ is a hydrocarbon residue e.g. a methylene residue.

Depending on the type of pretreatment, other groups, e.g. silicone surface-$NY_2$, with Y=H or alkyl (e.g. methyl, ethyl, etc.), can also be considered after a pretreatment with an $NH_3$ plasma (or similar plasmas). In particular, by pretreatment with $NH_3$ plasma, surface centers of the form silicone surface-$NH_2$ can be formed.

In a preferred embodiment of the optoelectronic device according to the invention, the anchor group of the chemical compounds is a group selected from one of the following groups:

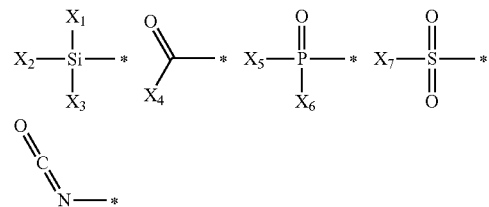

wherein
the residues $X_1$ to $X_3$, independently of one another, are selected from the group comprising —Cl, —Br, —I, —OH, $OR_1$, —H,
wherein no more than two of the residues $X_1$ to $X_3$ can be -H or $R_1$, wherein $R_1$ is an alkyl, and
$X_4$ is selected from the group comprising
—Cl, —Br, —I, —OH, —H, —$OSiX_1X_2X_3$
$X_5$, $X_6$, independently of one another, are selected from the group comprising
—Cl, —Br, —I, —OH, $OR_1$, —H,
$X_7$ is selected from the group comprising
—Cl, —Br, —I, —OH, $OR_1$.
$R_1$ is an alkyl or a fluorinated alkyl. In particular, $R_1$ is a short-chain alkyl residue, e.g. an alkyl residue with a chain length of $C_1$ to $C_7$. Particularly preferred are methyl, ethyl, propyl, butyl and pentyl. Most preferred are methyl and ethyl.

The symbol "*" here denotes in each case the binding site at which the head group can be bound. Alternatively, as will be explained below, a middle group can be attached at this site which can in turn be arranged between anchor group and head group.

By means of the anchor groups shown, e.g. a binding to the silicone surface is possible with the formation of acid esters (e.g. carboxylic acid esters, sulfonic acid esters etc.) but also with the formation of urea derivatives or urethane bonds.

According to at least one embodiment, the head group is an at least partly fluorinated linear or branched alkyl group, wherein the anchor group of the chemical compounds is selected from one of the following groups:

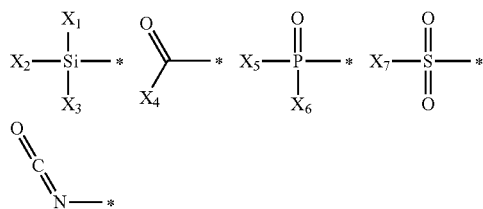

wherein
the residues $X_1$ to $X_3$, independently of one another, are selected from the group comprising
—Cl, —Br, —I, —OH, —OR$_1$, —H, -R$_1$,
wherein no more than two of the residues $X_1$ to $X_3$ can be -H or R$_1$, wherein R$_1$ is an alkyl, and
$X_4$ is selected from the group comprising
—Cl, —Br, —I, —OH, —H, —OSiX$_1$X$_2$X$_3$,
$X_5$, $X_6$, independently of one another, are selected from the group comprising
—Cl, —Br, —I, —OH, —OR$_1$, —H,
$X_7$ is selected from the group comprising
—Cl, —Br, —I, —OH, —OR$_1$.

In a further particularly preferred version of the optoelectronic device according to the invention, the anchor group is a group of the following general formula:

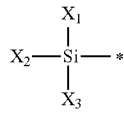

wherein
the residues $X_1$ to $X_3$, independently of one another, are selected from the group comprising
—Cl, —Br, —I, —OH, —OR$_1$, —H, —R$_1$,
wherein no more than two of the residues $X_1$ to $X_3$ can be —H or R$_1$, wherein R$_1$ is an alkyl.

By using a silyl anchor of this type, a strong binding of the chemical compound to the silicone surface can be achieved. Anchor groups of this type form particularly stable covalent bonds with the hydroxy groups or hydroperoxy groups already mentioned (silicone surface-OH, silicone surface-OOH) as chemically active surface centers. In addition, it is possible that a covalent bond is formed not only between the silyl anchor and the silicone surface but, depending on the choice of the residues $X_1$—$X_3$, covalent bonds can be formed between the anchor groups of adjacent chemical compounds, allowing an even more stable anchoring to be achieved. This is possible in particular when two or all three of the residues $X_1$—$X_3$ are selected from Cl, ——Br, —I, —OH, -OR$_1$.

In a further embodiment, nucleophilic groups, e.g. amino groups such as NH$_2$, are also possible for the anchor groups. In this way, efficient binding to surfaces comprising electrophilic active surface centers is possible.

Another embodiment of the optoelectronic device according to the invention is distinguished by the fact that, in addition to the anchor group and the head group, the chemical compounds also have a middle group which is arranged between the anchor group and the head group. For example, the middle group can be covalently bonded directly to the anchor group on the one hand and to the head group on the other hand. However, it is also possible that, for example, an oxygen or sulfur atom or another bridging atom is located between the middle group and the anchor group, via which the binding takes place. The same applies to the bond between the middle group and the head group.

By selecting suitable middle groups, particularly densely packed and ordered layers can be achieved. For example, particularly compact self-assembling monolayers can be achieved in this way.

Furthermore, the inventors have found that it is possible, for example, to use as the head group a strongly fluorinated alkyl residue (thus, for example, an alkyl residue in which more than 50% of the H atoms are replaced by F atoms, and preferably more than 75% of the H atoms are replaced by F atoms), in particular a perfluorinated alkyl residue, while it is sufficient to use conventional alkyl residues without fluorination or with only partial fluorination for the middle group. However, it is also possible that the middle group also comprises perfluorinated alkyl residues.

In a preferred embodiment of the optoelectronic device according to the invention, the middle group is selected from the group comprising linear alkyls, linear fluorinated alkyls, polyethylene glycol, polyethylene diamine, siloxanes and silanes. The middle group preferably has between 1 and 100 carbon atoms or silicon atoms in the backbone of the middle group, in particular between 1 and 50, more preferably between 1 and 20, particularly preferably between 1 and 10 and most preferably between 1 and 5 carbon atoms or silicon atoms. The middle group can have e.g. the general formula —(CH$_2$)$_m$— or —(SiH$_2$)$_m$— (with m=1 to 100, in particular m=1 to 50, preferably m=1 to 20, more preferably m=1 to 10, most preferably m=1 to 5).

However, it is likewise possible that the middle group is a siloxane group of the general formula —(O—SiR$^q$R$^p$)$_m$—, wherein m can assume the same values as described above for alkyl-based middle groups and wherein R$^q$ and R$^p$ can be hydrogen or short-chain alkyl residues, e.g. methyl or ethyl. Furthermore, R$^q$ and R$^p$, each independently of one another, can also be a phenyl residue.

In another preferred development of the optoelectronic device according to the invention, the optoelectronic device is in the form of a radiation-emitting optoelectronic device, in particular a light-emitting diode.

A different development of the optoelectronic device according to the invention is in the form of a photodetector.

Since, by controlling the layer thickness of the bound chemical compounds, which form no more than one monolayer, the transparency and radiation transmission of corresponding silicones are almost or completely unaffected, the present optoelectronic devices according to the invention are also suitable for use in the beam path of radiation-emitting devices. Radiation-emitting devices are particularly affected by adhering particles, since their emission characteristics and brightness can be negatively affected by particle adhesion. A reduction in adhesion can therefore have a positive effect on performance, reliability and in some cases even lifespan.

In another development, the silicone of the outer surface is part of an encapsulation material, part of a potting material, e.g. of a radiation-transmitting lens, or part of an external wavelength-converting layer, i.e. one which is located on the outer surface of the optoelectronic device.

In a further embodiment of the optoelectronic device according to the invention, dimethylsiloxane-based elastomers are used, in particular silicones based on dimethylsiloxane or partially phenylated dimethylsiloxane.

The invention further relates to a method for the production of an optoelectronic device comprising the method steps of:
- A) preparing an optoelectronic device comprising at least one outer surface with a silicone,
- B) preparing chemical compounds comprising an anchor group and a head group,
- C) reacting the anchor group of the chemical compounds with the silicone of the outer surface,
  - wherein the adhesion of the regions of the silicone located on the outer surface is reduced by the head groups of the chemical compounds.

The inventors of the present invention have observed that such a method enables the tack, i.e. particle adherence or coefficient of friction, of optoelectronic components to be reduced without at the same time coating any metal contacts (e.g. contacts of the lead frame) that may be present. This makes the further processing of the optoelectronic device considerably easier, since the metal contacts do not first have to be exposed before soldering or bonding, i.e. for electrical connection. In addition, owing to the fact that extremely thin and well controlled layer thicknesses are achieved in the method according to the invention, even in the case of an undesirable coating it is generally unnecessary to expose the contacts, since the layer thicknesses are sufficiently thin to have no negative effect on the electrical properties. In addition, the method is distinguished by low technical complexity and lower costs compared with conventional methods.

A preferred embodiment relates to the method according to the invention, wherein in step C) a covalent bond is formed between the anchor group and the silicone surface. Covalent bonds permit a directional and particularly stable attachment of the chemical compounds.

A preferred development relates to the method according to the invention, wherein the outer surface is subjected to a pretreatment before method step C).

A pretreatment in this case means a surface treatment or surface functionalization. The type of pretreatment here should be adapted to the type of substrate, i.e. the properties of the respective silicone, and to the nature of the anchor group of the chemical compound. Examples of pretreatments can be UV radiation or a treatment by means of plasma.

The inventors of the present invention have found that, by pretreating the outer surface, the density of the chemically active surface centers can be increased significantly. By UV radiation and/or plasma treatment, chemical bonds at the surface of the silicone can be broken and highly reactive or metastable groups, such as e.g. radicals or hydroperoxides, are formed. These increase the reactivity of the silicone surface and can either react themselves with the anchor function of the chemical compounds or can react further to form functional groups at the silicone surface (e.g. hydroxy groups). In this way, more functional groups are available on the surface of the silicone for a reaction with the anchor group of the chemical compounds. Thus, a higher density of the chemical compounds can be achieved, a more compact film produced and the tack reduced further.

Another development of the invention relates to a method according to the invention, wherein the outer surface is pretreated with a plasma before method step C). Particularly suitable plasmas here are, for example, oxygen plasma, argon plasma and $NH_3$ plasma or plasma composed of mixtures of these gases. However, other conventional plasma treatments can also be used. For large-surface-area or industrial applications, for example, the use of atmospheric plasma with air as the process gas is also suitable, provided that there are no outer surfaces present which are sensitive to oxidation.

The inventors of the present invention have found that, by using an oxygen plasma, it is possible to increase significantly the density of the chemically active surface centers on the silicone surface, in particular of silicone surface-OH and silicone surface-OOH but also silicone surface-$R^C$—COOH (wherein $R^C$ is an alkyl group, e.g. methylene; "silicone surface-OH" here denotes hydroxy groups bound to the silicone surface; this applies *mutatis mutandis* to the other groups described). In this way, significantly more chemical compounds can be bound to the silicone surface, leading to a greater reduction in adhesion.

By using $NH_3$ plasmas, nitrogen-containing surface centers such as the centers already mentioned above, silicone surface-$NY_2$, can be produced. These centers are suitable e.g. for binding anchor groups based on isocyanates.

In a further preferred embodiment of the method according to the invention, non-oxidizing plasmas are employed in the pre-treatment before method step C).

The inventors of the present invention have found that, by using the method according to the invention even without oxidizing plasmas, the density of the active chemical surface centers on the silicone surface can be increased. Plasmas of hydrogen or mixtures of hydrogen and argon, for example, are suitable. Inert gas plasmas can also be used. In particular, plasmas of noble gases, such as argon plasma or helium plasma, are particularly preferred since they permit efficient activation without undesirable oxidation of electrical contacts, as can be present in the optoelectronic device. Since an oxidizing plasma is not absolutely essential, silver contacts or other metal contacts which can be oxidized even more readily than silver, i.e. in particular metals with a lower standard reduction potential than silver, can also be treated by the method according to the invention without oxidation occurring. In this way, the processing of the optoelectronic device according to the invention is made substantially easier, since problems caused by oxidized metal contacts, e.g. oxidized silver contacts, can be avoided. In addition, the use of metals that are less noble than gold can be made possible in this way. The use of less noble metals leads to a significant cost saving. In addition, by using a method according to the invention in the form described here, substrates that are generally sensitive to oxidation, such as e.g. silver-coated substrates and lead frames, can be treated. This creates new possibilities e.g. in the field of radiation-emitting optoelectronic devices, e.g. in LED designs.

According to another preferred development of the method according to the invention, the reaction takes place in method step C) by means of dip coating or spray coating.

The inventors have found that a reaction by in method step C) in the context of a dip or spray coating leads to reliable film formation and thus to a decrease in adhesion. At the same time, both methods are suitable for use on an industrial scale. Dip and spray coating are preferable in particular for chemical compounds that are difficult to vaporize.

According to another preferred development of the method according to the invention, the reaction takes place in method step C) by means of deposition from the vapor phase, in particular by means of chemical vapor deposition (CVD). The use of plasma-enhanced chemical vapor deposition (PECVD) can also be considered. Deposition from the vapor phase is suitable for the deposition of chemical compounds that are capable of being vaporized without being destroyed and is particularly suitable for use on an industrial scale. It allows rapid, cost-effective manufacturing.

The figures, examples and experimental results are described in more detail below.

Figure 1B:
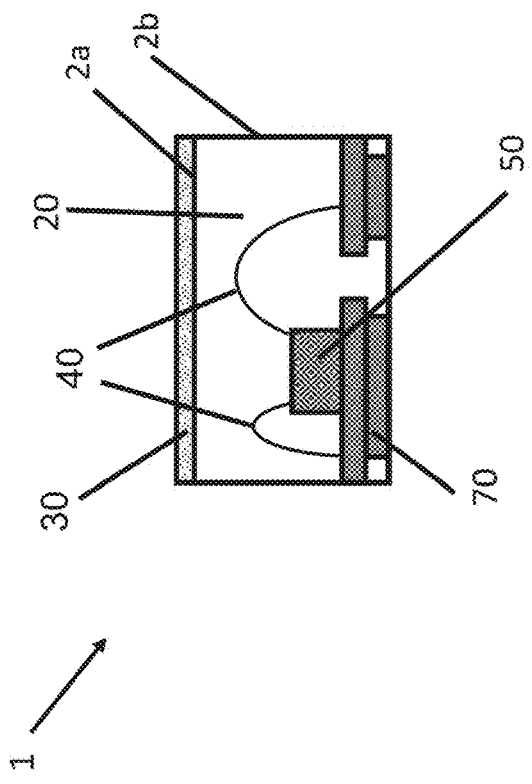

FIGS. 1A and 1B each show a schematic side view of a preferred embodiment of an optoelectronic device according to the invention (1). The device shown is in each case a light-emitting diode, comprising a radiation-emitting optoelectronic semiconductor (50), which can be bonded by means of wires (bond wires) (40) to conductive package components (70) (lead frames). The device comprises a silicone (20), which can form e.g. the encapsulation of the component. The silicone can be introduced, for example, as a potting. A multi-stage silicone encapsulation is also possible. The silicone can in addition contain fillers, e.g. colorants. In particular, wavelength-converting substances, which allow a shorter-wave primary radiation to be converted to a longer-wave secondary radiation, can be contained in the silicone as a filler. However, the silicone can also be free from fillers. In addition, it is possible that further components of the optoelectronic device comprise silicone. For instance, the device package can comprise components which can likewise comprise silicone. The optoelectronic device has at least one outer surface with a silicone (2). In the version illustrated, the potting silicone (20) has a surface on an external side of the optoelectronic device (2). An upper surface (2a) and side surfaces (2b) are shown. Devices according to the invention are characterized by a layer (30) of chemical compounds having an anchor group and a head group, the anchor group being bound to the silicone outer surface. Finally, the head group is responsible for a reduction in the adhesion or tack of the outer surface of the optoelectronic device according to the invention. The layer (30) can be applied, as shown in FIG. 1A, to only one or at least one surface, e.g. the upper surface (2a). However, it is also possible that multiple surfaces are covered with the layer (30). For example, the upper surface (2a) and one or all of the side surfaces (2b) can be covered with the layer (30). FIG. 1B shows an optoelectronic device in which all the silicone outer surfaces (2)—the upper surface (2a) and all the side surfaces (2b)—are covered with the adhesion-reducing layer (30). In this case, it is particularly easy to ensure that the optoelectronic device is well protected from adhering particles and contamination on all sides. In the case of a coating of only a particularly exposed surface, such as the upper surface in FIG. 1A, there may already be adequate reduction of the tack of the component for many applications. In addition, optoelectronic devices of this type are easier to manufacture than optoelectronic devices in which all silicone surfaces are coated.

Figure 2:
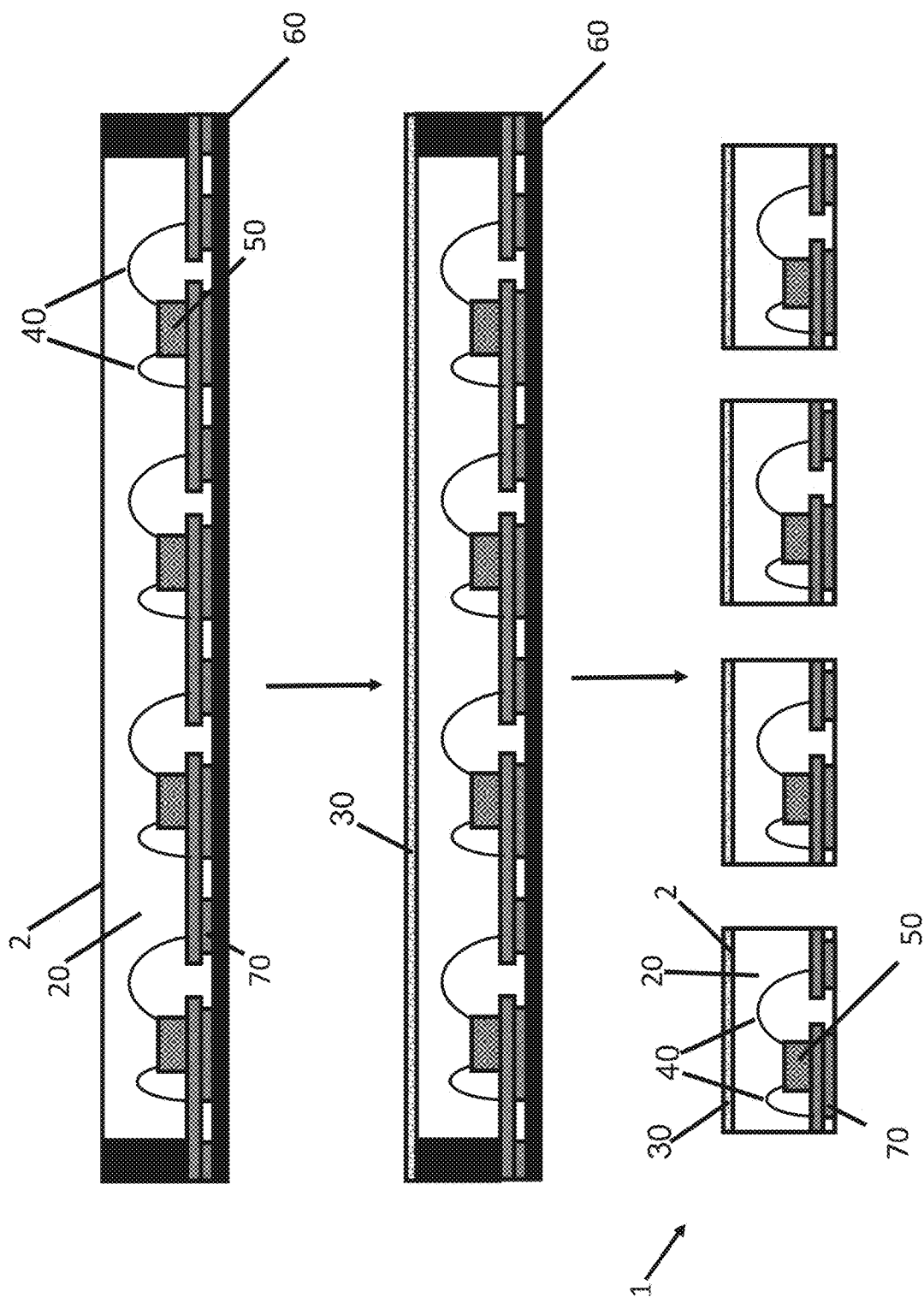

FIG. 2 shows a diagram of manufacturing steps for the production of an optoelectronic device (1) according to FIG. 1A. This shows the initially not yet singulated, i.e. non-separated, optoelectronic devices, for example comprising radiation-emitting optoelectronic semiconductors (50), which can be bonded to conductive package components (70) (lead frames) by means of wires (bond wires) (40). The non-singulated optoelectronic devices can be applied on a temporary substrate or carrier (60). This can be e.g. a peelable film. The silicone material (20) of the optoelectronic devices can be incorporated as a potting and has at least one outer surface (2). In a first method step, the non-singulated optoelectronic devices can be coated with a layer (30). In a further method step, the optoelectronic devices can be singulated, i.e. separated from one another. This can take place, for example, by separating them from the temporary substrate (60). As a result, an optoelectronic device according to FIG. 1A is obtained. Optoelectronic devices of this type have silicone outer surfaces on the sides, which are not coated. However, since these side surfaces often experience a certain roughening during singulation, i.e. separation of the optoelectronic devices from one another, their tack is generally already reduced. The method presented here offers the advantage of lower technical complexity compared with methods in which all the side surfaces are coated (cf. FIG. 3).

Figure 3:
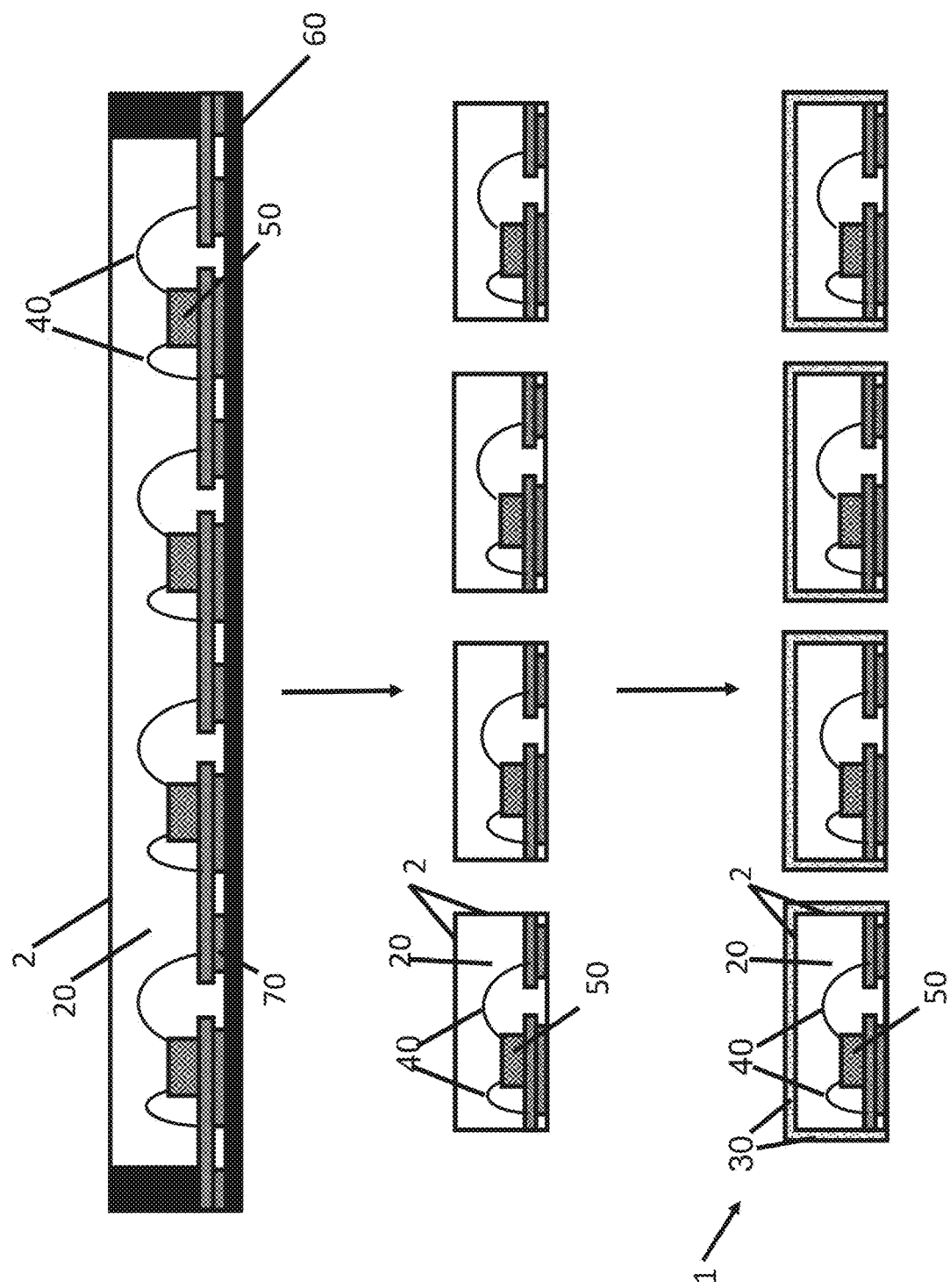

FIG. 3 shows a diagram of manufacturing steps for the production of an optoelectronic device (1) according to FIG. 1B. In contrast to the method shown in FIG. 2, the singulation, i.e. separation, of the optoelectronic devices takes place first in this case. This is followed by the binding of the chemical compounds and thus the application of a coating (30). Because the singulation takes place first and the coating takes place only afterwards, it is possible to coat not only the upper surface but also side surfaces of the silicone. In this way, it can be ensured that all the silicone surfaces (2) are covered with the adhesion-reducing layer (30) and protected from contaminants and adhering particles.

Figure 4:
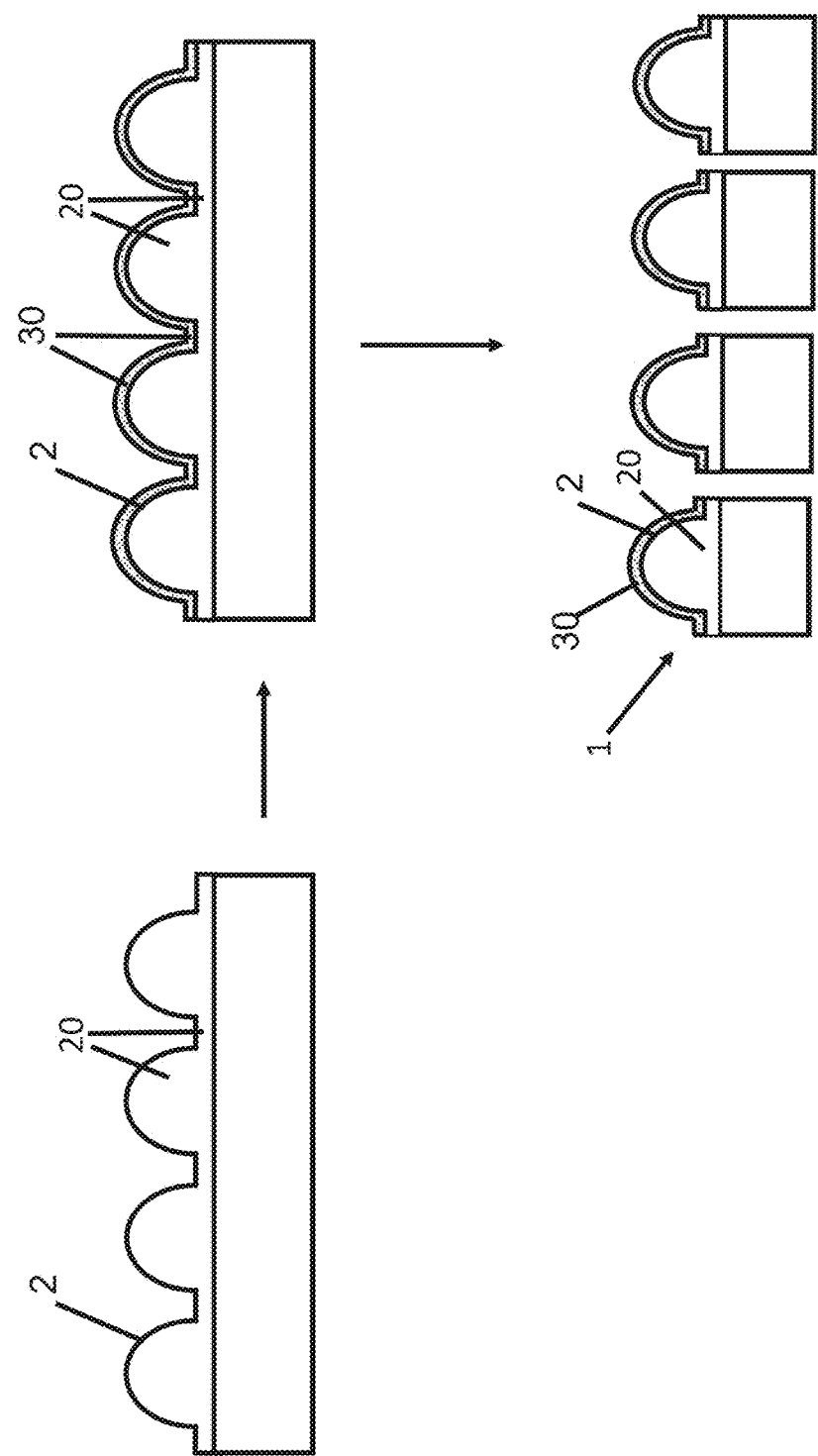

FIG. 4 shows a diagram of the production of an optoelectronic device comprising a silicone lens. As in the method shown in FIG. 2, a coating (30) before the individual optoelectronic devices are singulated or separated is shown again here by way of example. After the binding of the chemical compounds, and thus the application of the layer (30), the separation of the individual optoelectronic devices then takes place.

FIG. 5, left-hand side, shows a hydroxyl group as an example of a chemically active surface center and an example of a chemical compound for binding to the silicone surface. The latter has a silyl anchor group, a $CH_2CH_2$ group as a middle group and a $(CF_2)_7CF_3$ group as a head group. In the method according to the invention, the anchor group reacts with the hydroxy group on the silicone surface. In addition, depending on the anchor group, it is also possible for bonds to be formed with adjacent anchor groups. This is shown by way of example in the right-hand side illustration of the chemical compounds bound to the silicone surface. An illustration of the chemical compounds which are covalently bound by means of anchor group (3) to the outer surface of the optoelectronic device with silicone (2). The head groups (4) can be bound directly to the anchor groups (3). However, it is also possible for a middle group (5) to be arranged between the anchor group (3) and the head group (4). The chemical compounds of the optoelectronic device according to the invention can together form a coating or a film (30). Because of the directional binding to the silicone surface by means of chemisorption via covalent bonds, no multi-layers are formed but a maximum of a single covering, i.e. a monolayer, is achieved. The inventors have found that, for a significant reduction in tack, it is not necessary to achieve a complete monomolecular covering with the chemical compounds. Even a relatively low coverage can already lead to the desired effect of reducing adhesion. The residues mentioned for the groups (3), (4) and (5) only form one specific example. However, the statements made in connection with this illustration apply to all optoelectronic devices according to the invention. In the present case, the thickness of the layer L is e.g. one nanometer.

FIGS. 6A, 6B and 6C show images of particle adhesion tests on silicone outer surfaces with various treatments. The image 6A shows the particle adherence on an untreated, conventional silicone surface.

The image 6B shows the particle adhesion to silicone outer surfaces according to the present invention, wherein chemical compounds comprising an anchor group (3) and a head group (4) are bound to the silicone via the anchor group for the purpose of reducing adhesion or tack. A chemical compound according to the invention of the above-mentioned type according to the invention is therefore present on the silicone surfaces in the images 6B. In the case of the surfaces shown in image 6B, the silicone surface was not additionally pretreated, i.e. was not subjected to any plasma or UV treatment, before attaching the chemical compounds. Nevertheless, compared with image 6A, significantly lower particle adherence, i.e. reduced tack of the silicone outer surface, can already be observed.

Image 6C shows a silicone surface according to the invention comprising the same chemical compounds as the silicone surface of image 6B with the difference that the surface of the silicone has additionally been subjected to a pretreatment before the reaction with the chemical compounds. In the present case, an argon plasma treatment was carried out. As can be seen from image 6C, the silicone surface which was additionally pretreated with a plasma before the attachment of the chemical compounds has an even lower particle count than the surface without plasma treatment (image 6B). The tack or particle adherence is therefore reduced even more significantly in the case of additional pretreatment, which can be explained by the introduction of additional chemically active surface centers, e.g. hydroxyl groups, during the pretreatment, which can act as further attachment points for the anchor groups of the chemical compounds. By means of the pretreatment, therefore, the density of the chemical compounds bound to the silicone surface or the compactness of the resulting self-assembling layer (SAM) is increased. The test results show that, both with and without pretreatment, a significant reduction in tack is achieved, with the effect being reinforced by the pretreatment.

There follows a description of the way in which the surfaces shown in images 6B and 6C were obtained.

To this end, the samples with the silicone surfaces for the particle adhesion tests shown in FIG. 6C were pretreated with a low-pressure argon plasma. The silicones tested in the present case were heat-curable, addition-crosslinking, two-component silicones ("2K silicones") based on dimethylsiloxane. The plasma treatment times here can vary as a function of the type of surface to be treated and the plasma unit. In the present case, a plasma treatment of 10 to 90 seconds proved sufficient, but longer plasma treatment times are also possible. Following the plasma treatment (in the present example within 30 minutes), the coating took place by dipping in a coating solution. The dipping operation here lasted approx. 30 seconds. An example of a particularly suitable coating solution here is a solution comprising 1H,1H,2H,2H-perfluorodecyltrichlorosilane as the chemical compound. As shown in FIG. 5, the trichlorosilane group can act as an anchor group here, while a perfluorinated alkyl residue acts as a head group. Between these there is an ethylene middle group. For example, an alcoholic solution of the said chemical compound can be employed, but other common solvents can also be used. The surface treatment was carried out in the same way, but without a plasma pre-treatment for the silicone surfaces for which particle adhesion tests are shown in FIG. 6B. In both cases, following immersion in the coating solution, the sample was heated to approx. 125° C. for 5 minutes. In this step, the binding of the chemical compounds to the silicone surface takes place. Following this, the surfaces were rinsed with isopropanol to remove excess, unbound material. Next, the samples were dried, which can take place for example in an air current. During the coating operation, it must be ensured that the surface to be coated is completely immersed in the coating solution.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

This patent application claims the priority of the German patent application 102015103335.6, the disclosure content of which is hereby incorporated by reference.

The invention claimed is:

1. An optoelectronic device
comprising at least one outer surface with a silicone,
wherein chemical compounds comprising an anchor group and a head group are bound to the silicone via the anchor group,
wherein the adhesion of the regions of the silicone present on the outer surface is reduced owing to the head groups of the chemical compounds
wherein the head group is an at least partly fluorinated linear or branched alkyl group,
wherein the anchor group of the chemical compounds is selected from one of the following groups:

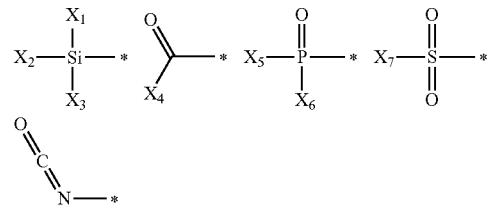

wherein
the residues $X_1$ to $X_3$, independently of one another, are selected from the group comprising —Cl, —Br, —I, —OH, —OR$_1$, —H, —R$_1$,
wherein no more than two of the residues $X_1$ to $X_3$ can be —H or R$_1$, wherein R$_1$ is an alkyl, and
$X_4$ is selected from the group comprising
Cl, —Br, —I, —OH, —H, —OSiX$_1$X$_2$X$_3$
$X_5$, $X_6$, independently of one another, are selected from the group comprising
Cl, —Br, —I, —OH, —OR$_1$, —H,
$X_7$ is selected from the group comprising
Cl, —Br, —I, —OH, —OR$_1$.

2. The optoelectronic device according to claim 1, wherein the chemical compounds bound to the silicone via the anchor group form a monomolecular layer.

3. The optoelectronic device according to claim 1, wherein the chemical compounds bound to the silicone via the anchor group form a self-assembling monolayer.

4. The optoelectronic device according to claim 1, wherein the head group is a linear alkyl group.

5. The optoelectronic device according to claim 1, wherein the head group a perfluorinated alkyl group.

6. The optoelectronic device according to claim 1, wherein the anchor group of the chemical compounds is bound to the silicone by a covalent bond.

7. The optoelectronic device according to claim 1, wherein the chemical compounds additionally comprise a middle group, which is arranged between the anchor group and the head group.

8. The optoelectronic device according to claim 7, wherein the middle group is selected from the group comprising linear alkyls, linear fluorinated alkyls, polyethylene glycol, polyethylene diamine as well as siloxanes and silanes.

9. The optoelectronic device according to claim 1 in the form of a radiation-emitting device.

10. A method with which the optoelectronic device according to claim 1 is produced comprising the following method steps:
 A) preparing the optoelectronic device comprising the at least one outer surface with the silicone,
 B) preparing the chemical compounds comprising the anchor group and the head group,
 C) reacting the anchor group of the chemical compounds with the silicone of the outer surface,
 wherein the adhesion of the regions of the silicone present on the outer surface is reduced owing to the head groups of the chemical compounds.

11. The method according to claim 10, wherein the outer surface is subjected to a pretreatment before method step C).

12. The method according to claim 11, wherein the outer surface is pretreated with a plasma before method step C).

13. The method according to claim 11, wherein the outer surface is pretreated with a non-oxidizing plasma before method step C).

14. The method according to claim 10, wherein method step C) takes place by means of dip coating or spray coating.

15. The method according to claim 10, wherein method step C) takes place by means of deposition from the vapor phase.

16. The method according to claim 15, wherein method step C) takes place by means of chemical vapor deposition.

17. The optoelectronic device according to claim 1 in the form of a light-emitting diode.

18. An optoelectronic device comprising at least one outer surface with a silicone,
 wherein chemical compounds comprising an anchor group and a head group are bound to the silicone via the anchor group, and
 wherein the adhesion of the regions of the silicone present on the outer surface is reduced owing to the head groups of the chemical compounds, wherein the chemical compounds bound to the silicone via the anchor group form a self-assembling monolayer.

* * * * *